(12) United States Patent  
Imai (10) Patent No.: US 8,835,944 B2  
(45) Date of Patent: Sep. 16, 2014

(54) LIGHTING DEVICE

(71) Applicants: Citizen Electronics Co., Ltd., Fujiyoshida (JP); Citizen Holdings Co., Ltd., Nishi-Tokyo (JP)

(72) Inventor: Sadato Imai, Minamitsuru-gun (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 91 days.

(21) Appl. No.: 13/726,986

(22) Filed: Dec. 26, 2012

(65) Prior Publication Data

US 2013/0161662 A1  Jun. 27, 2013

(30) Foreign Application Priority Data

Dec. 26, 2011 (JP) ................. 2011-282673

(51) Int. Cl.
  *H01L 33/08* (2010.01)
  *H01L 33/48* (2010.01)
  *H05K 1/05* (2006.01)
  *H01L 25/075* (2006.01)
  *H01L 33/64* (2010.01)

(52) U.S. Cl.
  CPC .......... *H01L 33/48* (2013.01); *H05K 2201/017* (2013.01); *H01L 25/0753* (2013.01); *H05K 1/053* (2013.01); *H01L 2224/48091* (2013.01); *H01L 2224/48137* (2013.01); *H01L 33/644* (2013.01); *H01L 33/08* (2013.01); *H05K 2201/10106* (2013.01)
  USPC .......................................... 257/88

(58) Field of Classification Search
  USPC ................................. 257/82, 88, 99
  See application file for complete search history.

(56) References Cited

U.S. PATENT DOCUMENTS

| | | | | |
|---|---|---|---|---|
| 7,510,889 | B2 * | 3/2009 | Pan et al. | 438/26 |
| 7,829,903 | B2 * | 11/2010 | Takeda et al. | 257/98 |
| 2006/0281341 | A1 * | 12/2006 | Soeta | 439/66 |

FOREIGN PATENT DOCUMENTS

| | | |
|---|---|---|
| JP | 59-9982 A | 1/1984 |
| JP | 2011-151248 A | 8/2011 |

* cited by examiner

*Primary Examiner* — Thao P Le
(74) *Attorney, Agent, or Firm* — Browdy and Neimark, PLLC (57) ABSTRACT

In a first aspect of the present invention, a lighting device including a metal plate, an electrical insulation layer that is smaller in size than an outline of the metal plate and arranged on an upper surface of the metal plate, a light-emitting element mounted on the electrical insulation layer, and a first connecting electrode and a second connecting electrode electrically connected to the light-emitting element and arranged on the electrical insulation layer.

20 Claims, 7 Drawing Sheets

LIGHTING DEVICE

CROSS-REFERENCE TO RELATED APPLICATION

This application is based on and claims the priority benefit of Japanese Patent Application No. 2011-282673, filed on Dec. 26, 2011, the disclosure of which is incorporated herein by reference in its entirety.

BACKGROUND OF THE INVENTION

1. Field of the Invention

The present invention relates to a lighting device including a light-emitting element, and relates to a lighting device including a light-emitting element and a metal plate to which the light-emitting element is thermally connected.

2. Description of the Related Art

There is a lighting device including an alumina-layer-coated aluminum plate, on which a light-emitting element is mounted (For example, see FIGS. 3 and 4 of Japanese Patent Application Laid-Open No. Sho. 59-9982).

Furthermore, there is a lighting device including a ceramic-ink coated aluminum substrate (For example, see Japanese Patent Application Laid-Open No. 2011-151248).

The above-mentioned alumina layer or the ceramic ink layer entirely layered on a surface of a metal plate. When metal plates of the above-mentioned lighting devices are divided from a metal plate assembly with an alumina layer or a ceramic ink layer entirely layered on a surface of the metal plate assembly, there may be liable to crack at the alumina layer or at the ceramic ink in a dividing or dicing step of the metal plate assembly. If there is a crack at an alumina layer or at a ceramic ink layer layered on a metal plate, an electrical insulation may deteriorate.

SUMMARY OF THE INVENTION

The present invention is proposed in view of conventional lighting devices as above described.

In a first aspect of the present invention, a lighting device including a metal plate, an electrical insulation layer that is smaller in size than an outline of the metal plate and arranged on an upper surface of the metal plate, a light-emitting element mounted on the electrical insulation layer, and a first connecting electrode and a second connecting electrode electrically connected to the light-emitting element and arranged on the electrical insulation layer.

It is disclosed that an upper surface of the metal plate appears around a periphery of the electrical insulation layer.

In a second aspect of the present invention, a lighting device including a metal plate, an electrical insulation layer that is smaller in size than an outline of the metal plate and arranged on an upper surface of the metal plate, a plurality of light-emitting elements arranged in lines and mounted at a central area of the electrical insulation layer, a first connecting electrode and a second connecting electrode arranged on the electrical insulation layer, and the light-emitting elements positioned between the first connecting electrode and the second connecting electrode and electrically connected to the first connecting electrode and to the second connecting electrode.

It is also disclosed that lower surfaces of the light-emitting elements are buried in the electrical insulation layer.

DETAILED DESCRIPTION OF EMBODIMENTS

It will be understood that, although the terms first, second, etc. may be used herein to describe various elements and/or portions of an element, these elements and/or portions of an element should not be limited by these terms. These terms are only used to distinguish one element from another and/or one portion from another of an element. For example, a first element and/or a first portion could be termed a second element and/or a second portion, and, similarly, a second element and/or a second portion could be termed a first element and/or a first portion, without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, steps, operations, elements, components, and/or portions of an element, but do not preclude the presence or addition of one or more other features, integers, steps, operations, elements, components, portions, and/or groups thereof.

Relative terms such as "below" or "above" or "upper" or "lower" may be used herein to describe a relationship of one element, layer or region to another element, layer or region as illustrated in the figures. It will be understood that these terms are intended to encompass different orientations of a device in addition to the orientation depicted in the figures.

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

Figure 1:
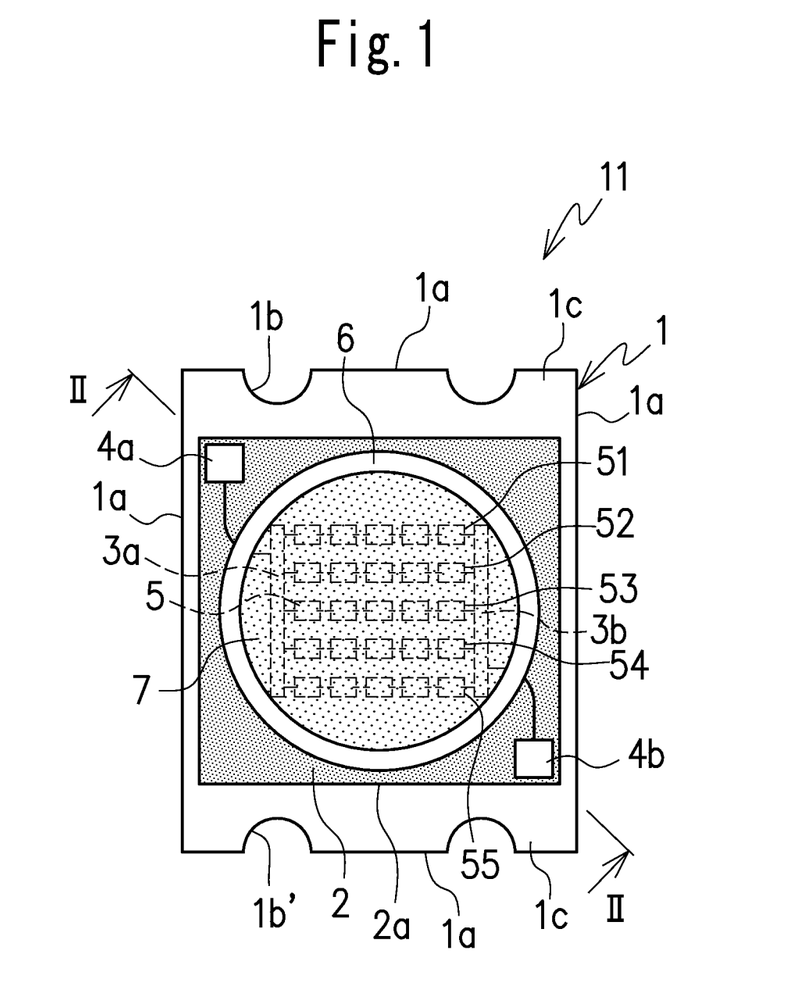
FIG. 1 is a schematic top plan view showing a lighting device according to an embodiment of the present invention.

As shown in FIG. 1, a lighting device 11 includes a metal plate 1, an electrical insulation layer 2 that is smaller in size than an outline of the metal plate 1 and arranged on an upper surface 1c of the metal plate 1, a light-emitting element 5 mounted on the electrical insulation layer 2, and a first connecting electrode 3a and a second connecting electrode 3b that are electrically connected to the light-emitting element 5 and arranged on the electrical insulation layer 2. In this first embodiment, the light-emitting elements 5 are positioned at a central area of the electrical insulation layer 2. The central area can be demarcated by a frame 6 in which a light-transmitting resin is filled to seal the light-emitting elements 5. The frame 6 is disposed on the electrical insulation layer 2. The light-transmitting resin sealing the light-emitting elements 5 and metal wires 8 for electrical connection can constitute a light-emitting area of the lighting device 11. The light-transmitting resin may include a phosphor to convert a part of light emitted from the light-emitting element 5.

For more details, a lighting device 11 includes a metal plate 1, an electrical insulation layer 2 that is smaller in size than an outline of the metal plate 1 and arranged on an upper surface 1c of the metal plate 1, a plurality of light-emitting elements 5 arranged in lines 51-55 and mounted at a central area of the electrical insulation layer 2, a first connecting electrode 3a and a second connecting electrode 3b arranged on the electrical insulation layer 2; and the light-emitting elements 5 positioned between the first connecting electrode 3a and the second connecting electrode 3b and electrically connected to the first connecting electrode 3a and to the second connecting electrode 3b.

The electrical insulation layer 2 in this embodiment is square in shape on the upper surface 1c of the metal plate 1. As it is required that the electrical insulation layer 2 is positioned on the upper surface of the metal plate 1 within the periphery 1a of the metal plate 1 to prevent a possibility of cracking at electrical insulation layer through manufacturing process. The electrical insulation layer 2 is positioned separately from the periphery of the metal plate 1. A periphery 1a of the metal plate 1 is an outline of the metal plate 1. If the electrical insulation layer 2 is smaller than an outline of the metal plate, the metal plate can be divided from a metal plate assembly at positions where the upper surface of the metal plate appears. Accordingly, the shape of the electrical insulation layer 2 smaller than the outline of the metal plate 1 can be square or rectangular on the upper surface 1c of the metal plate 1, in accordance with the number of lines of light-emitting elements 5 and/or the number of light-emitting elements 5 arranged in each line, for example.

The metal plate 1 can be an aluminum plate. The electrical insulation layer 2 can be a ceramic ink layer.

As shown in FIG. 1, the lighting device 11 further includes a first external connecting electrode 4a that is electrically connected to the first connecting electrode 3a, and a second external connecting electrode 4b that is electrically connected to the second connecting electrode 3b and positioned at an opposite side of the first external connecting electrode 4a. The first external connecting electrode 4a and the second external connecting electrode 4a are disposed on the electric insulation layer 2 and positioned outside of the light-emitting area. Electrodes such as the first connecting electrode 3a, the second connecting electrode 3b, the first external connecting electrode 4a and the second external connecting electrode 4b can be formed on the electric insulation layer 2 by printing or vapor depositions, for example.

Figure 4:
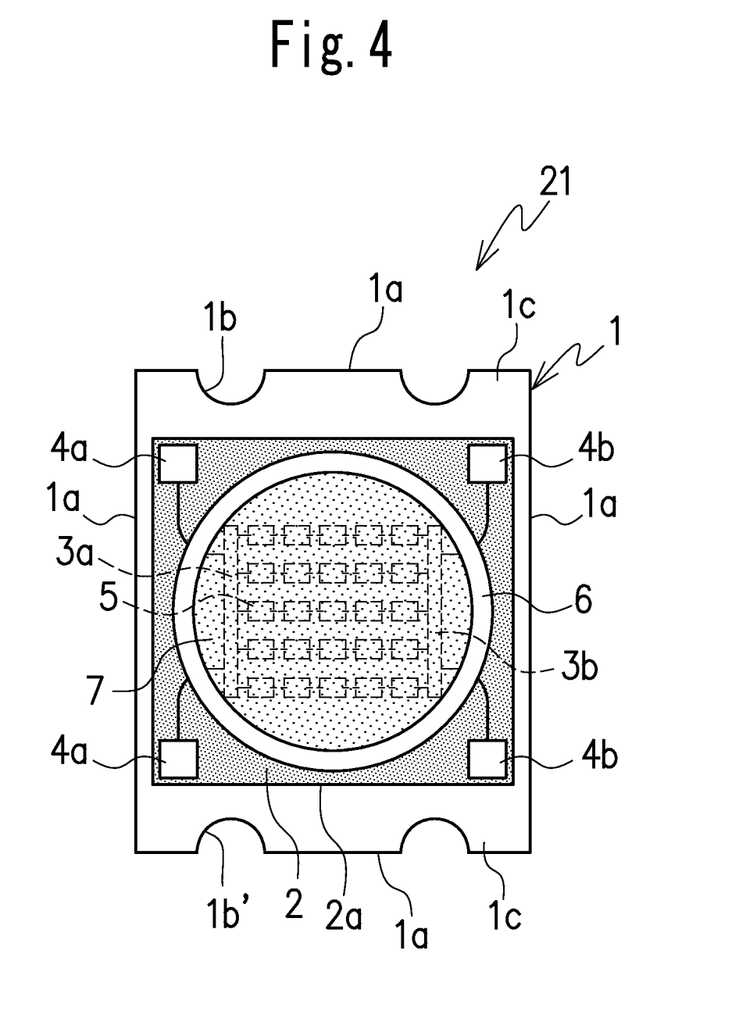
FIG. 4 is a schematic top plan view showing a second embodiment of the present invention.

In this first embodiment, the first external connecting electrode 4a and the second external connecting electrode are disposed at opposite corners of the electrical insulation layer 2 that is square. FIG. 4 is a schematic top plan view showing a lighting device 21 according to a second embodiment of the present invention. As shown in FIG. 4, it is also possible to dispose two first external connecting electrodes 4a and two second external connecting electrodes 4b on the electric insulation layer 2 at four corners of the electric insulation layer 2. With this configuration, it may be easier to supply voltage to the light-emitting elements 5 of the lighting device 11 from electrodes of a motherboard and/or terminals of an electronic device and/or a lighting system in which the lighting device 11 can be installed.

Figure 2:
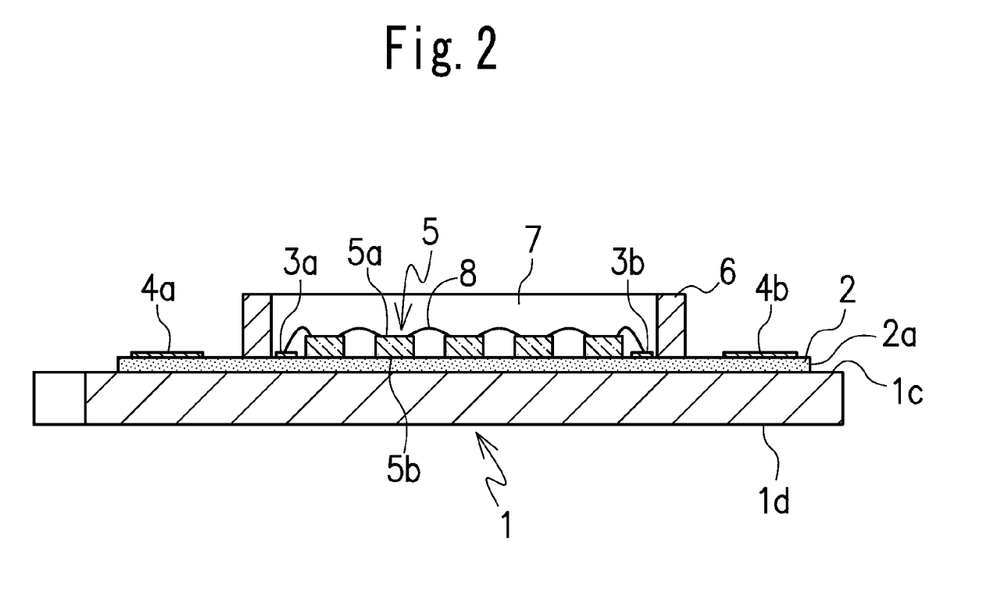
FIG. 2 is a cross-sectional view showing the lighting device of FIG. 1, taken along line II-II of FIG. 1.

FIG. 2 shows a cross-sectional view of the lighting device 11 taken along line II-II shown in FIG. 1. The light-emitting element 5 at a lower surface 5b of the light-emitting element 5 is in contact with the electrical insulation layer 2.

Figure 3:
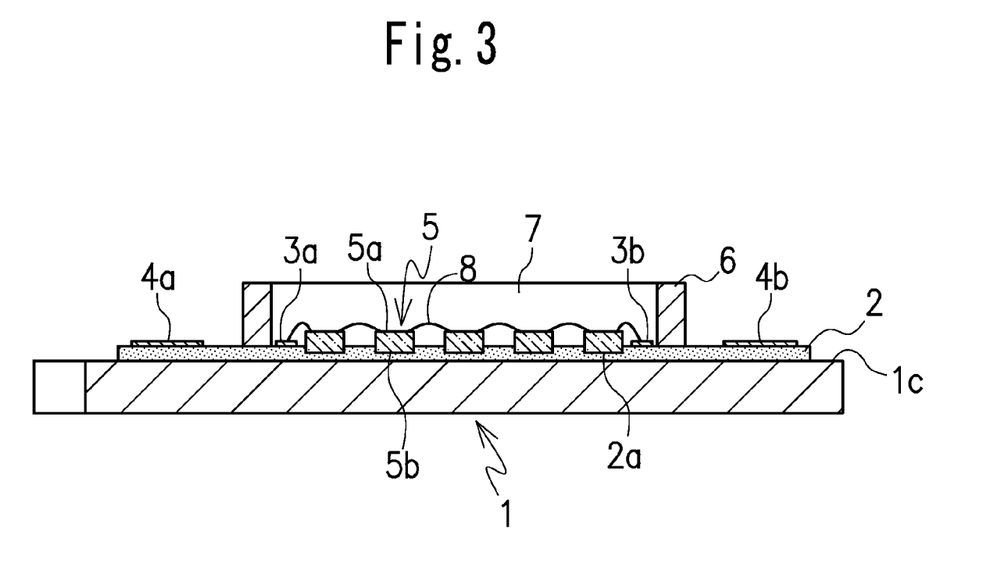
FIG. 3 is a cross-sectional view showing a variation of the lighting device of FIG. 2.

FIG. 3 is a cross-sectional view of a variation of the lighting device 11. In this variation, the lower surface 5b of the light-emitting element 5 may be buried in the electrical insulation layer 2, and the light-emitting elements 5 can be held in the electrical insulation layer 2, before the electrical insulation layer 2 is cured. As a result, after the electrical insulation layer 2 is cured, the lower surfaces 5b of the light-emitting elements 5 can be firmly adhered and held in the electrical insulation layer 2. Also, it is possible to provide recesses 2a at positions of the electrical insulation layer 2 on which the light-emitting elements 5 are to be mounted. It may be easier to position the light-emitting elements 5 in the recesses 2a. A p-n junction of a light-emitting element 5 that is formed at the boundary of a p-semiconductor and a n-semiconductor emits light. Accordingly, the p-n junction should be positioned higher than an upper surface of the electric insulation layer 2, however, if the p-n junction is positioned close to the upper surface of the electric insulation layer 2, light emitted downward from the light-emitting element 5 can be reflected by the upper surface of the electric insulation layer 2 efficiently.

The electrical insulation layer 2 may be a white ceramic ink layer that can reflect light. Hence, the electric insulation layer 2 can reflect light emitted from the light-emitting elements 5 that are mounted on the electric insulation layer 2. The ceramic ink used as the electric insulation layer 2 in the present embodiment may include a viscous liquid containing a powder material of an inorganic oxide and can be cured at a temperature of about 160° C., for example. The thickness of the electric insulation layer 2 can be increased in accordance with the increase of voltage to be supplied to the light-emitting elements 5. The thickness of the electric insulation layer 2 for the lighting device 11 may be set in a range of from 10 to 30 μm depending on the use conditions of the lighting device 11.

The upper surface 1c of the metal 1 plate appears around a periphery 2a of the electrical insulation layer 2. In the present embodiment, the metal plate 1 further includes a cut portion 1b passing from the upper surface 1c to a lower surface 1d of the metal plate 1. The cut portion may be a circular passing through hole. The cut portion 1b may be semicircular notch cut into a periphery 1a of the metal plate 1 and passing from the upper surface 1c to a lower surface 1d of the metal plate 1. The cut portion 1b is formed at an area where the upper surface 1c of the metal plate 1 appears around the periphery 2a of the electric insulation layer 2. It is possible to use a screw to fix the lighting device 11 at the cut portion 1b to a motherboard and/or a heat sink of an electronic device and or a lighting system in which the lighting device 11 can be installed. It is preferable to provide a pair of cut portions 1b positioned at opposite sides and/or opposite corners of the metal plate 1. Since the cut portions are positioned at an area without the electric insulation layer 2, it is possible to avoid a possibility of causing a crack at the electric insulation layer 2 when fixing the lighting device 11 to the motherboard and/or a heat sink by screws.

As shown in FIG. 1, the metal plate 1 includes a first cut portion 1b cut into a periphery 1a of the metal plate 1 and passing from the upper surface 1c to a lower surface 1d of the metal plate 1 and a second cut portion 1b' cut into the periphery 1a of the metal plate 1 and passing from the upper surface 1c to a lower surface 1d of the metal plate 1. The first cut portion 1b is positioned at a first side of the periphery 1a, and the second cut portion 1b' is positioned at a second side, which is the opposite side of the first side of the periphery. Also, it is possible to provide two first cut portions 1b at the first side of the periphery 1a of the metal plate 1 and to provide two second cut portions 1b at the second side of the periphery 1a of the metal plate 2.

In accordance with required emission power of light, it is possible to arrange a plurality of light-emitting elements 5 in lines 51-55. The lines 51-55 of the plurality of light-emitting elements 5 are arranged in parallel between the first connecting electrode 3a and the second connecting electrode 3b. The first connecting electrode 3a may be formed in a linear shape and the second connecting electrode 3b may be formed into a linear shape that extends in parallel with the first connecting electrode 3a. Also, the first connecting electrode 3a may be formed into an arcuate shape and the second connecting electrodes 3b may be formed into an arcuate shape that faces the arcuate shape of the first connecting electrode 3a. The light-emitting elements 5 are mounted in the lines 51-55 between the first connecting electrode 3a and the second connecting electrode 3b. A pair of element electrodes (p-electrode and n-electrode) are positioned at an upper surface 5a of the light-emitting element 5 and are electrically connected in series to p-electrode and n-electrode of another light-emitting elements 5 positioned at both sides of the light-emitting element 5 through metal wires 8.

Accordingly, the light-emitting elements 5 are electrically connected to the first connecting electrode 3a and the second connecting electrode 3b through the metal wires 8 at opposite ends of each line of the lines 51-55 of light-emitting elements 5.

The plurality of light-emitting elements 5 mounted on the insulating layer 2 can be what are called LED bare chips and have a square or rectangular outer shape in top view. The LED bare chip may be a wafer level chip. The light-emitting element 5 can also be an LED chip having a square or rectangular outer shape in top plan view and including an LED bare chip and a substrate to hold the LED bare chip thereon. The light-emitting element 5 to be arranged may include a phosphor layer that receives a part of light emitted from the LED bare chip and perform wavelength conversion of the light. Instead, a light-transmitting resin for sealing the light-emitting elements 5 as mentioned above may contain a phosphor, or a phosphor layer may be arranged above the light-emitting elements 5 to achieve what is called a remote phosphor.

FIGS. 5-8 shows a manufacturing process to manufacture a plurality of lighting devices 11 collectively. This manufacturing method includes preparing a metal plate assembly 10 that includes a plurality of cut portions 1b disposed with a space between one another of the cut portions 1b, forming a plurality of electric insulation layers 2 on an upper surface 10c of the metal plate assembly 10 with a space between one another of the electric insulation layers 2, forming electrodes 3a, 3b, 4a, and 4b on the upper surface 10c of the electric insulation layers 2, electrically mounting light-emitting elements 5 in a central area of each of the electric insulation layers 2, and dicing the metal plate assembly 10 at positions between adjacently disposed electric insulation layers 2. Accordingly it is possible to avoid a possibility of causing a crack at the electric insulation layers 2.

Figure 5:
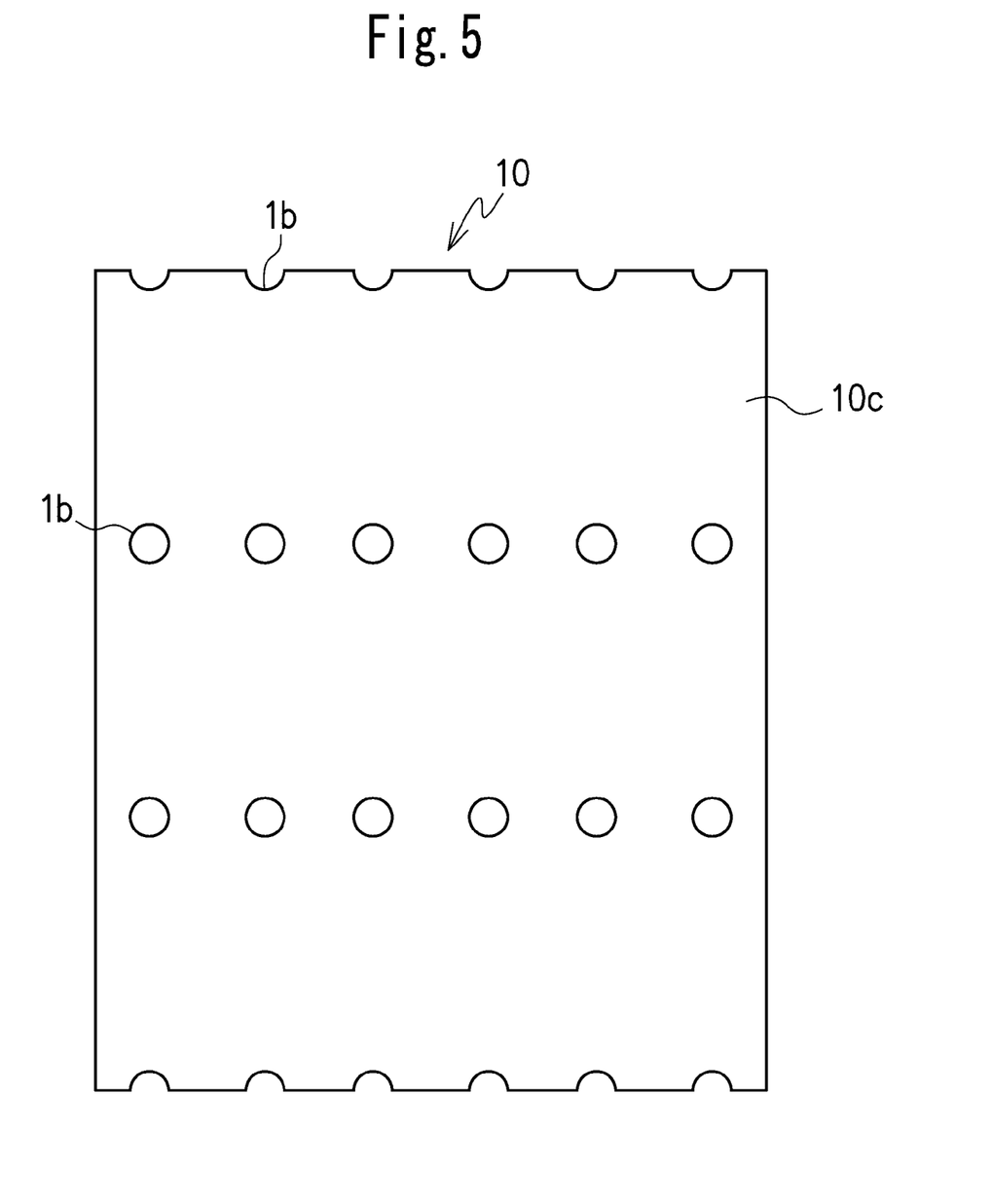
FIG. 5 is a top plan view showing a metal plate assembly configured to be divided into a plurality of metal plates.

FIG. 5 is a top plan view showing a metal plate assembly 10 configured to be divided into a plurality of metal plate 1. The metal plate assembly 10 includes a plurality of cut portions 1b disposed with a space between one another in lines. The metal plate assembly 10 can be divided on the cut portions 1b into a plurality of metal plates 1. If the cut portion 1b is circular in shape and divided, the cut portion 1b may be semicircular in shape.

Figure 6:
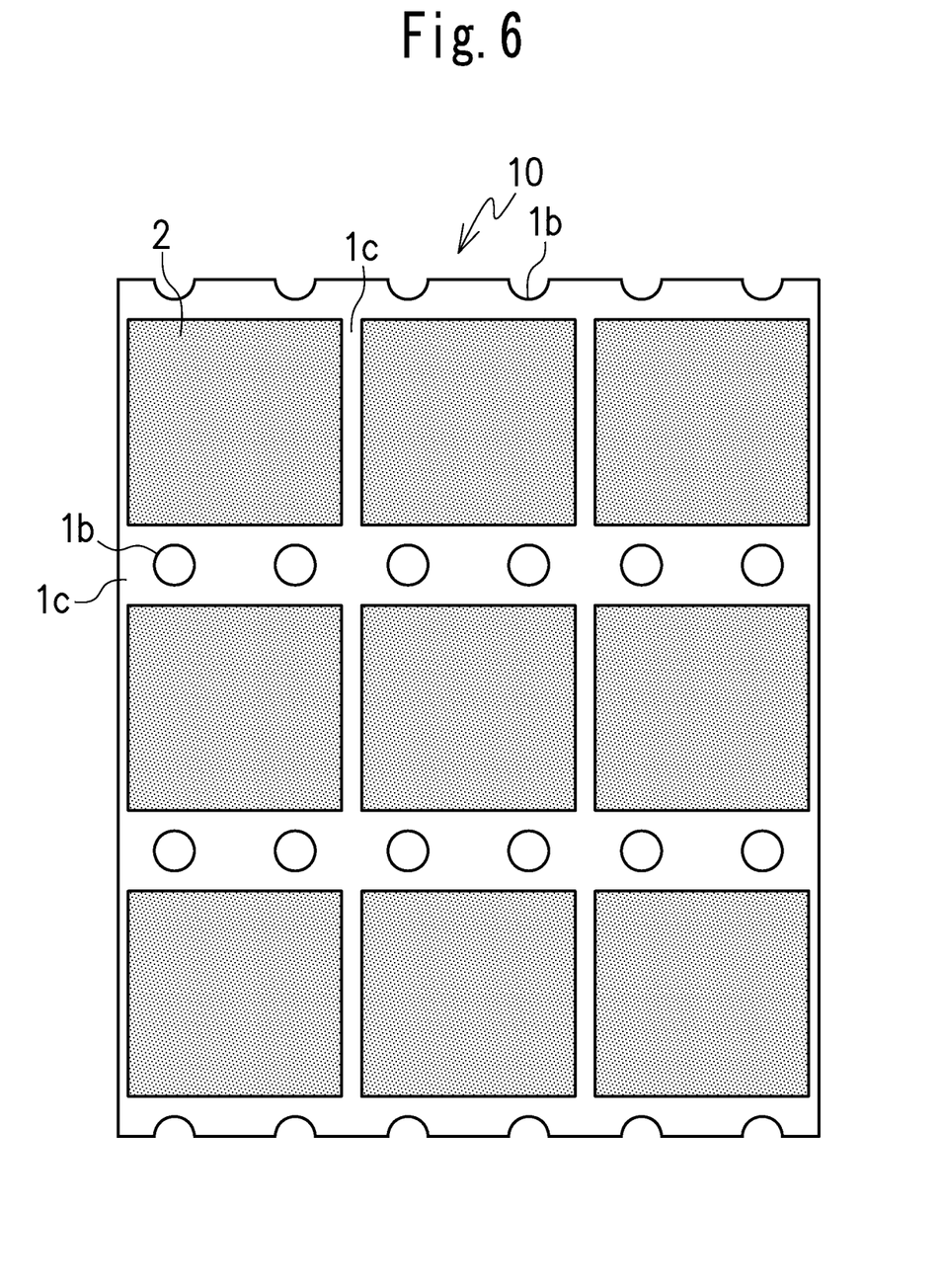
FIG. 6 is a top plan view showing a metal plate assembly including separately arranged electrical insulation layers arranged on an upper surface of the metal plate assembly shown in FIG. 5.

FIG. 6 is a top plan view showing a metal plate assembly including separately arranged electrical insulation layers on the upper surface of the metal plate assembly shown in FIG. 5. The electrical insulation layers 2 may be ceramic ink layers.

Figure 7:
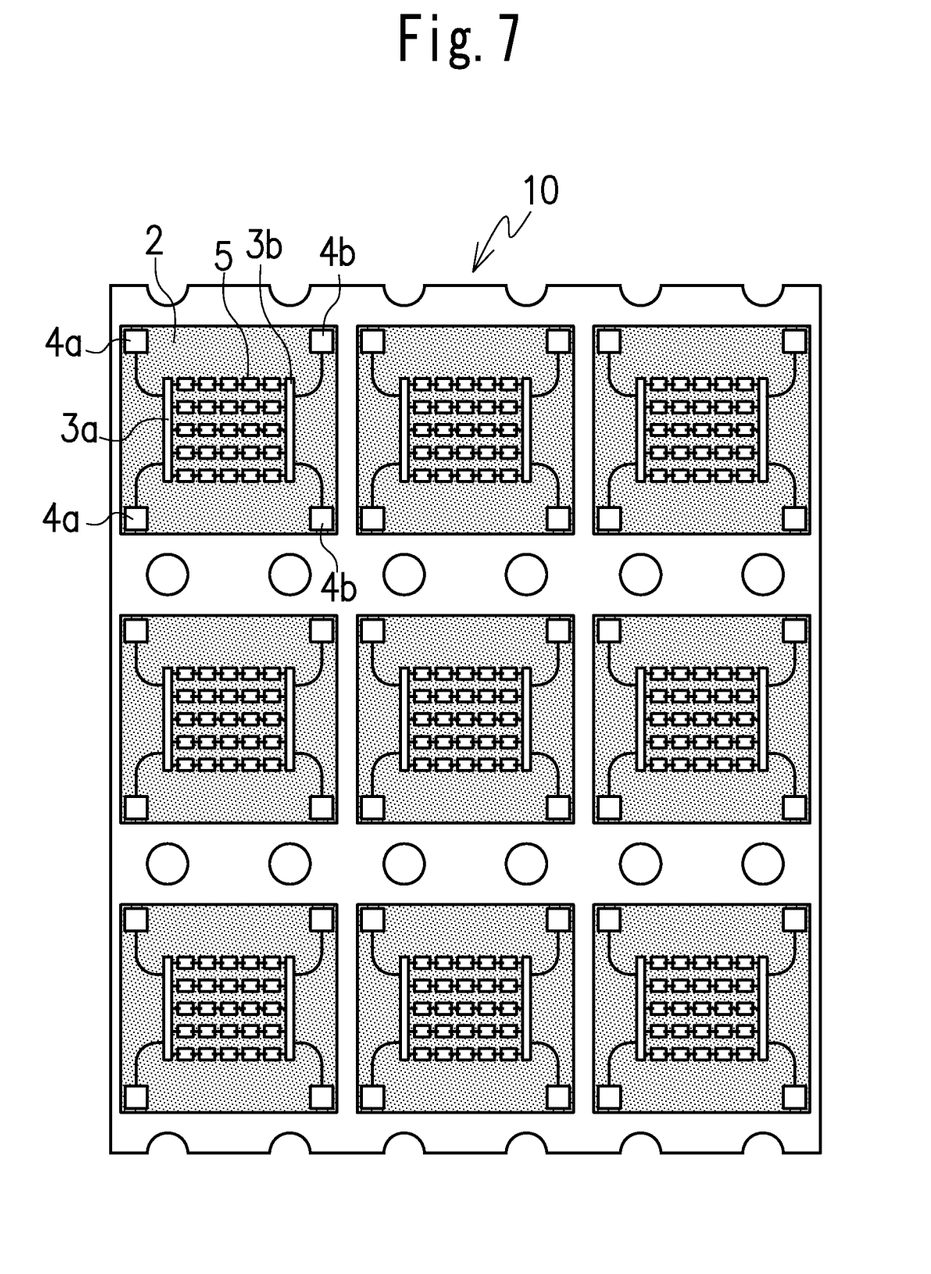
FIG. 7 is a top plan view showing a metal plate assembly including separately arranged electrical insulation layers, each on which light-emitting elements are arranged and electrically connected to a first external connecting electrode through a first connecting electrode and to a second external connecting electrode through a second connecting electrode.
Figure 8:
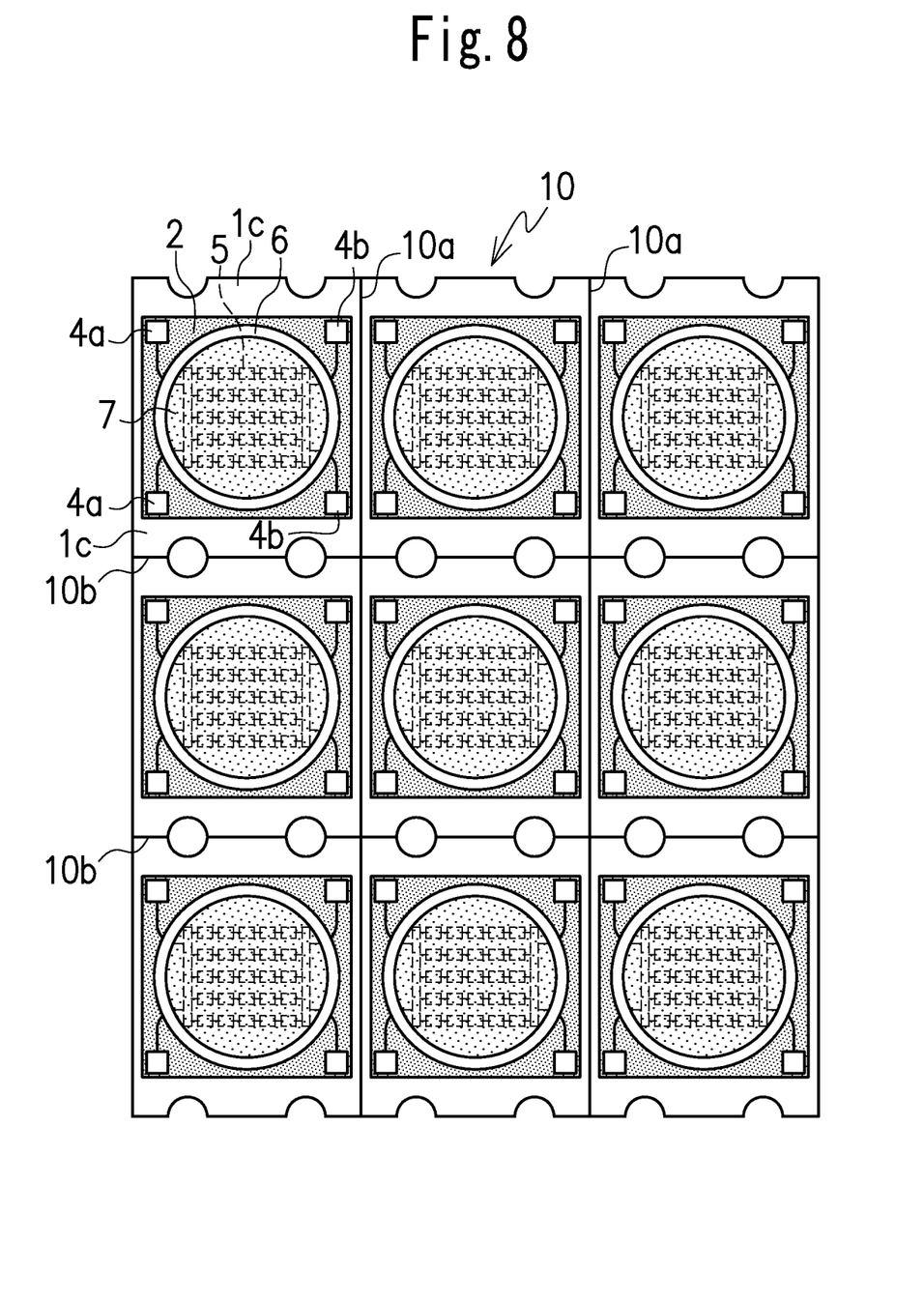
FIG. 8 is a top plan view showing a metal plate assembly including separately arranged electrical insulation layers, each on which light-emitting elements are arranged, electrically connected to a first external connecting electrode through a first connecting electrode and to a second external connecting electrode through a second connecting electrode, and sealed by a light-transmitting resin.

FIG. 7 is a top plan view showing a metal plate assembly including separately arranged electrical insulation layers, each on which light-emitting elements 5 are arranged and electrically connected to a first external connecting electrode 4a through a first connecting electrode 3a and to a second external connecting electrode 4b through a second connecting electrode 3b.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:
1. A lighting device, comprising:
   a metal plate;
   an electrical insulation layer that is smaller in size than an outline of the metal plate and arranged on an upper surface of the metal plate;
   a light-emitting element mounted on the electrical insulation layer;
   a first connecting electrode and a second connecting electrode electrically connected to the light-emitting element and arranged on the electrical insulation layer.
2. The lighting device according to claim 1, wherein the electrical insulation layer is square in shape on the upper surface of the metal plate.
3. The lighting device according to claim 1, wherein the electrical insulation layer is rectangular in shape on the upper surface of the metal plate.

4. The lighting device according to claim 1, wherein the metal plate comprises an aluminum plate.

5. The lighting device according to claim 1, wherein the electrical insulation layer comprises a ceramic ink layer.

6. The lighting device according to claim 1, wherein the light-emitting element at a lower surface of the light-emitting element is in contact with the electrical insulation layer.

7. The lighting device according to claim 6, wherein the lower surface of the light-emitting element is buried in the electrical insulation layer.

8. The lighting device according to claim 1, wherein the upper surface of the metal plate appears around a periphery of the electrical insulation layer.

9. The lighting device according to claim 5, wherein the metal plate further comprises a cut portion cut into a periphery of the metal plate and passing from the upper surface to a lower surface of the metal plate.

10. A lighting device, comprising:
a metal plate;
an electrical insulation layer that is smaller in size than an outline of the metal plate and arranged on an upper surface of the metal plate;
a plurality of light-emitting elements arranged in lines and mounted at a central area of the electrical insulation layer;
a first connecting electrode and a second connecting electrode arranged on the electrical insulation layer; and
the light-emitting elements positioned between the first connecting electrode and the second connecting electrode and electrically connected to the first connecting electrode and to the second connecting electrode.

11. The lighting device according to claim 10, wherein the electrical insulation layer is square in shape on the upper surface of the metal plate.

12. The lighting device according to claim 10, wherein the electrical insulation layer is rectangular in shape on the upper surface of the metal plate.

13. The lighting device according to claim 10, wherein the lines of light-emitting elements are extended parallel to one another of the lines between the first connecting electrode and the second connecting electrode, and the light-emitting elements included in each of the lines between the first connecting electrode and the second connecting electrode are electrically connected in series to one another by metallic wires.

14. The lighting device according to claim 10, wherein the metal plate comprises an aluminum plate.

15. The lighting device according to claim 10, wherein the electrical insulation layer comprises a ceramic ink layer.

16. The lighting device according to claim 10, wherein the light-emitting elements at lower surfaces of the light-emitting elements are in contact with the electrical insulation layer.

17. The lighting device according to claim 16, wherein the lower surfaces of the light-emitting elements are buried in the electrical insulation layer.

18. The lighting device according to claim 10, wherein the upper surface of the metal plate appears around a periphery of the electrical insulation layer.

19. The lighting device according to claim 5, wherein the metal plate further comprises a first cut portion cut into a periphery of the metal plate and passing from the upper surface to a lower surface of the metal plate and a second cut portion cut into a periphery of the metal plate and passing from the upper surface to a lower surface of the metal plate, and the second cut portion is positioned at an opposite side of the first cut portion.

20. The lighting device according to claim 10, wherein the electrical insulation layer comprises a ceramic ink layer.

\* \* \* \* \*